United States Patent
Kim et al.

(10) Patent No.: US 11,251,324 B2
(45) Date of Patent: Feb. 15, 2022

(54) METHOD FOR MANUFACTURING PEROVSKITE SILICON TANDEM SOLAR CELL

(71) Applicant: LG ELECTRONICS INC., Seoul (KR)

(72) Inventors: Seongtak Kim, Seoul (KR); Seh-Won Ahn, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/616,688

(22) PCT Filed: May 28, 2018

(86) PCT No.: PCT/KR2018/006046
§ 371 (c)(1),
(2) Date: Nov. 25, 2019

(87) PCT Pub. No.: WO2018/221913
PCT Pub. Date: Dec. 6, 2018

(65) Prior Publication Data
US 2020/0212243 A1    Jul. 2, 2020

(30) Foreign Application Priority Data
May 29, 2017   (KR) .................. 10-2017-0066438

(51) Int. Cl.
*H01L 31/0725* (2012.01)
*H01L 31/0224* (2006.01)
(Continued)

(52) U.S. Cl.
CPC .... *H01L 31/0725* (2013.01); *H01L 31/02366* (2013.01); *H01L 31/022433* (2013.01);
(Continued)

(58) Field of Classification Search
CPC ......... H01L 31/0725; H01L 31/022433; H01L 31/022466; H01L 31/02366;
(Continued)

(56) References Cited

U.S. PATENT DOCUMENTS

2015/0249170 A1* 9/2015 Snaith ................ H01L 31/1884
136/256
2018/0005764 A1* 1/2018 Jones ....................... C25D 3/54

FOREIGN PATENT DOCUMENTS

KR    10-2014-0091489 A    7/2014
KR    10-2015-0124412 A    11/2015
(Continued)

OTHER PUBLICATIONS

Cao et al., "Porous PbI2 films for the frabriciation of efficient stable perovskite solar cells via sequential deposition," Journal of Materials Chemistry A, vol. 4, 2016, pp. 10223-10230.
(Continued)

*Primary Examiner* — Hoang-Quan Ho
(74) *Attorney, Agent, or Firm* — Birch, Stewart, Kolasch & Birch, LLP

(57) ABSTRACT

The present disclosure relates to a method for manufacturing a monolithic tandem solar cell in which a perovskite solar cell is laminated and bonded on a silicon solar cell. According to the present disclosure, a first microporous precursor thin film is formed through a sputtering method on a substrate having an unevenly structured texture and then a halide thin film is formed on the first microporous precursor thin film to form a perovskite absorption layer, whereby light reflectance can be reduced and a path of light can be increased, and accordingly a light absorption rate can be increased.

12 Claims, 6 Drawing Sheets

(51) Int. Cl.
  *H01L 31/0236* (2006.01)
  *H01L 31/0368* (2006.01)
  *H01L 31/0392* (2006.01)

(52) U.S. Cl.
  CPC .. *H01L 31/022466* (2013.01); *H01L 31/0392* (2013.01); *H01L 31/03685* (2013.01)

(58) Field of Classification Search
  CPC .......... H01L 31/03685; H01L 31/0392; H01L 31/0236; H01L 31/18; H01L 31/043; H01L 31/186; H01L 31/0687; H01L 31/02363; Y02E 10/545; Y02E 10/548; Y02E 10/544; Y02P 70/50
  See application file for complete search history.

(56) References Cited

FOREIGN PATENT DOCUMENTS

| KR | 10-2016-0004220 A   |   | 1/2016 |
|----|---------------------|---|--------|
| WO | WO-2014045021 A     | * | 3/2014 |
| WO | WO 2016/094966 A1   |   | 6/2016 |
| WO | WO 2017/011239 A1   |   | 1/2017 |

OTHER PUBLICATIONS

Zhang et al., "A Smooth CH3NH3PbI3 Film via a New Approach for Forming the PbI2 Nanostructure Together with Strategically High CH3NH3I Concentration for High Efficient Planar-Heterojunction Solar Cells," Advanced Energy Materials, vol. 5, No. 1501354, 2015, pp. 1-10.

\* cited by examiner

METHOD FOR MANUFACTURING PEROVSKITE SILICON TANDEM SOLAR CELL

CROSS REFERENCE TO RELATED APPLICATIONS

This application is the National Phase of PCT International Application No. PCT/KR2018/006046, filed on May 28, 2018, which claims priority under 35 U.S.C. 119(a) to Korean Patent Application No. 10-2017-0066438, filed in Republic of Korea on May 29, 2017, all of these applications are hereby expressly incorporated by reference into the present application.

BACKGROUND

1. Technical Field

The present disclosure relates to a method of manufacturing a monolithic tandem solar cell in which a perovskite solar cell is stacked on and bonded to a silicon solar cell.

2. Description of the Related Art

Crystalline silicon (c-Si) solar cells are representative single-junction solar cells which are currently widely used as commercial solar cells. However, due to the low photoelectric conversion efficiency of crystalline silicon solar cells, the development of a tandem solar cell which is constructed by connecting two single-junction solar cells having absorption layers of different band gaps is actively ongoing.

FIG. 1 is a schematic cross-sectional view of a two-terminal tandem solar cell, which is a common type of tandem solar cell.

Referring to FIG. 1, in the solar cell, a single-junction solar cell including an absorption layer having a relatively large band gap and a single-junction solar cell including an absorption layer having a relatively small band gap are tunnel-junctioned through a inter-layer.

Perovskite/crystalline silicon tandem solar cells have been attracting attention as potential candidates for achieving a photovoltaic efficiency of more than 30%, where a single junction solar cell including an absorption layer having a relatively large bandgap among various types of two-terminal tandem solar cells is used as a perovskite solar cell and a single junction solar cell including an absorption layer having a relatively small bandgap is used as a crystalline silicon solar cell.

In a perovskite/crystalline silicon tandem solar cell, a texture structure is formed on a surface of a crystalline silicon substrate to reduce the reflectance of incident light. The perovskite layer formed on the silicon substrate is commonly formed using a liquid solution process.

However, even if a solution for forming the perovskite layer is applied on a substrate having a textured structure, the applied solution undergoes a leveling phenomenon over time due to the nature of a solution, that is, low viscosity which is inherent in a liquid phase. As a result, there is a problem that the textured structure of the substrate is not mirrored in the upper portion of the perovskite absorption layer.

When the textured structure is not mirrored in front portions as such, not only the reflectance of incident light is increased, but also a path of the light having a long wavelength absorbed in the crystalline silicon tandem solar cell disposed at rear portion is shortened, and therefore, there is a problem that a light absorption rate in the crystalline silicon tandem solar cell is lowered.

In addition, as an incident light having a short wavelength selectively absorbed in the perovskite solar cell disposed in front is transmitted through the perovskite absorption layer without being sufficiently collected therein, there is a concern that transmission loss may occur.

SUMMARY

The present disclosure is directed to forming, through a sputtering process, a first precursor thin film of a perovskite absorption layer on a substrate of a tandem solar cell on which a texture structure is formed.

Through this, the present disclosure is directed to forming a microporous perovskite absorption layer in a tandem solar cell.

The manufacturing method of the present disclosure is directed to forming a conformal perovskite absorption layer and conformal subsequent layers on the textured substrate.

Therefore, the manufacturing method of the present disclosure is directed to increasing the light absorption rate of a tandem solar cell by reducing the reflectance of light and lengthening a path of light.

According to an embodiment of the present disclosure for forming a conformal perovskite absorption layer and conformal subsequent layers on a textured substrate of a tandem solar cell, there may be provided a method of manufacturing a perovskite/silicon tandem solar cell, which includes: performing a sputtering process for forming a microporous first precursor thin film on a textured substrate; and performing a process of forming a halide thin film on the microporous first precursor thin film.

There may be provided a method of manufacturing a perovskite/silicon tandem solar cell in which the first precursor thin film has a $BX_2$ structure, wherein B includes one or more among $Pb^{2+}$, $Sn^{2+}$, $Cu^{2+}$, $Ca^{2+}$, $Sr^{2+}$, $Cd^{2+}$, $Ni^{2+}$, $Mn^{2+}$, $Fe^{2+}$, $Co^{2+}$, $Pd^{2+}$, $Ge^{2+}$, $Yb^{2+}$, and $Eu^{2+}$ and X includes one or more among $F^-$, $Cl^-$, $Br^-$, and $I^-$.

There may be provided a method of manufacturing a perovskite/silicon tandem solar cell in which the microporous thin film has a porosity of 10 to 50% by volume.

There may be provided a method of manufacturing a perovskite/silicon tandem solar cell in which the halide is an organic halide.

There may be provided a method of manufacturing a perovskite/silicon tandem solar cell in which the halide has an AX structure, wherein A consists of one or more among a monovalent $C_1$-$C_{20}$ alkyl group, an alkyl group substituted with an amine group, an organic amidinium, and an alkali metal, and X consists of one or more among $F^-$, $Cl^-$, $Br^-$, and $I^-$.

There may be provided a method of manufacturing a perovskite/silicon tandem solar cell in which the performing of the process of forming a halide thin film includes performing any one method among a thermal evaporation method, a sputtering method, a spin coating method, a dip coating method, a chemical vapor deposition method, and a spraying method.

There may be provided a method of manufacturing a perovskite/silicon tandem solar cell in which the performing of a post-thermal process is additionally applied after the process of forming a halide.

There may be provided a method of manufacturing a perovskite/silicon tandem solar cell in which the post-thermal process is carried out at 25 to 200° C. for at most three hours.

There may be provided a method of manufacturing a perovskite/silicon tandem solar cell in which the thin film formed by the post-thermal process has a thickness of 50 nm to 10 μm.

According to the present disclosure, a microporous perovskite layer can be formed on a textured substrate, through a sputtering process and subsequent processes.

As a result, a conformal perovskite layer and conformal subsequent layers can be formed on a textured substrate. Accordingly, since it is possible not only to reduce the reflectance of light but also to lengthen a path of light when manufacturing a perovskite solar cell and a perovskite/silicon tandem solar cell, an effect of increasing a light absorption rate can be produced.

In addition, with the manufacturing method of the present disclosure, since the damage of the thin film and defects such as pinholes are suppressed, a perovskite layer having excellent thin-film quality can be formed, and therefore, tandem solar cell efficiency can be improved.

DETAILED DESCRIPTION OF EXEMPLARY EMBODIMENTS

Hereinafter, a tandem solar cell and a method of manufacturing the same according to exemplary embodiments of the present disclosure will be described in detail with reference to the accompanying drawings.

However, the present disclosure is not limited to embodiments described below and may be implemented in a variety of different forms, and the embodiments are only provided to complete the disclosure of the invention and to fully inform the scope of the invention to those skilled in the art.

Figure 1:
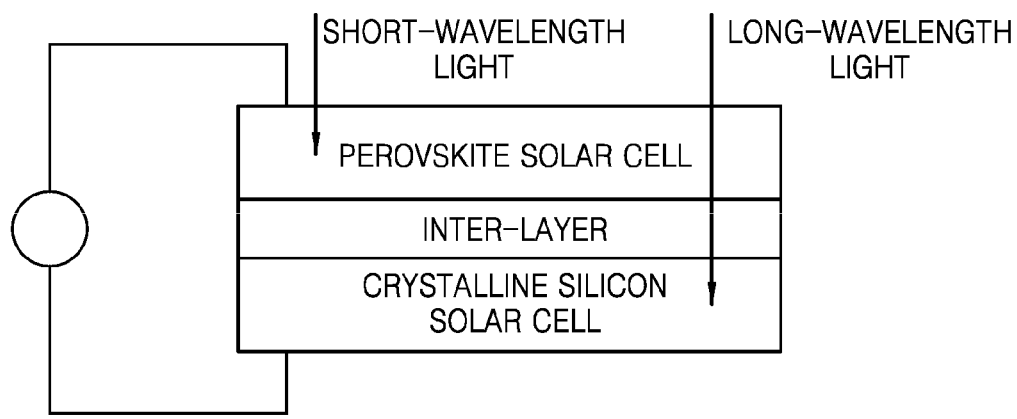
FIG. 1 is a schematic view for illustrating a common tandem solar cell.
Figure 2:
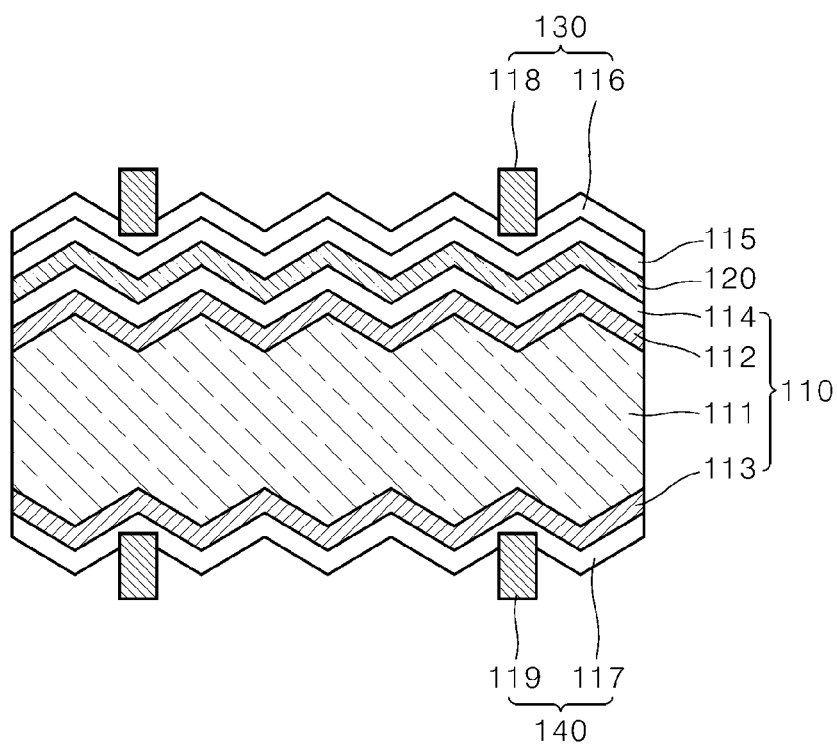
FIG. 2 is a cross-sectional view of a tandem solar cell according to one embodiment of the present disclosure.
Figure 3:
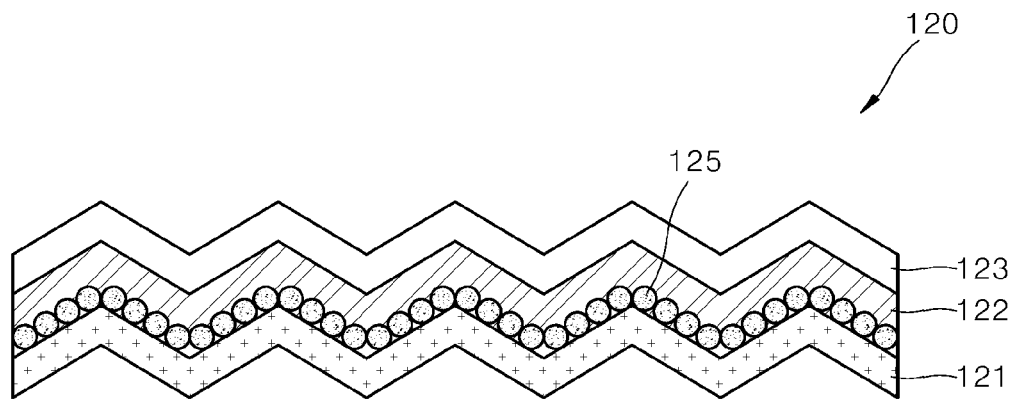
FIG. 3 is a detailed cross-sectional view of the perovskite solar cell of FIG. 2.

FIG. 2 is a cross-sectional view of a tandem solar cell according to one embodiment of the present disclosure, and FIG. 3 is a detailed cross-sectional view of the perovskite solar cell of FIG. 2.

Referring to FIGS. 2 and 3, a tandem solar cell 100 according to a first embodiment of the present disclosure has a structure of a two-terminal tandem solar cell in which a perovskite solar cell 120, as a second solar cell including an absorption layer having a relatively large band gap, and a silicon solar cell 110, as a first solar cell including an absorption layer having a relatively small band gap, are directly tunnel-junctioned through a inter-layer 114 (also referred to as a tunnel junction layer or an intermediate layer).

Accordingly, among light incident on the tandem solar cell 100, light in a short-wavelength region is absorbed by the perovskite solar cell 120 which is the second solar cell disposed in a front portion, whereby electrical charges are generated, and light in a long-wavelength region is transmitted through the second solar cell 120 and absorbed by the silicon solar cell 110 which is the first solar cell disposed in a rear portion, whereby electrical charges are generated.

Since the second solar cell 120 disposed in the front portion is capable of generating electricity by absorbing light in a short-wavelength region and the first solar cell 110 disposed in the rear portion is capable of generating electricity by absorbing light in a long-wavelength region, the threshold wavelength can be shifted toward longer wavelengths, and therefore, the tandem solar cell 100 having the above-described structure has the advantage that the range of wavelengths absorbed by the entire solar cell can be broadened.

The above-described tandem solar cell 100 according to one embodiment of the present disclosure includes a silicon solar cell 110 as a first solar cell, a perovskite solar cell 120 as a second solar cell, a inter-layer 114, a first electrode 140, and a second electrode 130.

The first solar cell 110 of the present disclosure may be implemented as a heterojunction silicon solar cell or homojunction silicon solar cell.

When the first solar cell 110 is a heterojunction silicon solar cell, the first solar cell 110 may have a structure in which very thin amorphous intrinsic silicon (i a-Si:H) as a passivation layer is first formed on front and rear sides of an n-type crystalline silicon substrate, a p-type high-concentration amorphous silicon (p a-Si:H) layer as an emitter layer 112 is formed on a second surface which is on the front side, and, on the rear side, a high-concentration amorphous silicon (n+ a-Si:H) layer as a back surface field (hereinafter abbreviated as BSF) layer 113 is formed on a first surface.

An amorphous silicon layer has an advantage of being a material which not only has an energy band gap of about 0.6 to 0.7 eV larger than an energy band gap of a crystalline silicon layer which is about 1.1 eV, but also can be formed with a very small thickness during a deposition process. Due to the advantageous features of the amorphous silicon layer, as light absorption loss in a short-wavelength region is minimized, a light utilization rate can be ultimately increased, and a high open-circuit voltage and an effective back surface field can be attained.

Generally, for heterojunctions having a difference in band gaps, there is a very high possibility that lattice mismatch may occur between different materials. However, when an amorphous silicon layer is used, the lattice mismatch does not occur because an amorphous material lacks regularity in a crystal lattice unlike a crystalline material. Therefore, when an intrinsic amorphous silicon (i a-Si) layer is deposited on a crystalline silicon substrate, there is an advantage that a recombination at a surface of a silicon substrate can also be effectively reduced.

In the present disclosure, it is more preferred that a hydrogenated intrinsic amorphous silicon (i a-Si:H) layer is used as the intrinsic amorphous silicon layer. This is because by entering the amorphous silicon due to a hydrogenation reaction, hydrogen can reduce a dangling bond state of the amorphous silicon and a localized energy state within an energy band gap.

However, when a hydrogenated intrinsic amorphous silicon (i a-Si:H) layer is used, a temperature of a subsequent processe is limited to 250° C. or less and more preferably 200° C. or less. This is because the hydrogen bonding inside amorphous silicon breaks at a process temperature exceeding 200° C.

Therefore, in a subsequent process, there is a restriction that, particularly, firing in a process of forming a metal grid electrode, should also be carried out at a low temperature. On the other hand, there is an additional advantage that since the temperature of a subsequent process is low, the risk of thermal damage can be reduced.

In addition, the first solar cell 110 of the present disclosure may also be implemented as a homojunction crystalline silicon solar cell. Specifically, the first solar cell 110 has an emitter layer 112 disposed on a second surface of a crystalline silicon substrate 111. In addition, the first solar cell 110 may further have a BSF layer 113 disposed on a first surface of the crystalline silicon substrate 111. That is, the first solar cell 110 may have a two-layer structure in which a silicon substrate 111 and an emitter layer 112 are sequentially stacked. In addition, the first solar cell 110 may also have a three-layer structure in which a BSF layer 113, a silicon substrate 111, and an emitter layer 112 are sequentially stacked.

Here, since a layer doped with impurities of a different conductivity type from that of the crystalline silicon substrate 111 is used as the emitter layer 112 and a layer doped with impurities of the same conductivity type as that of the crystalline silicon substrate 111 is used as the BSF layer 113, a homojunction crystalline silicon solar cell 110 can be realized.

For example, when the crystalline silicon substrate 111 is an n-type monocrystalline silicon substrate, a semiconductor layer doped with p-type impurities is used as the emitter layer 112 and a semiconductor layer doped with n-type impurities is used as the BSF layer 113. Here, the BSF layer 113 may be an n+-type semiconductor layer which is doped at a higher concentration than the concentration of the n-type impurities used for doping the crystalline silicon substrate 111.

Here, the crystalline silicon substrate 111 of the first solar cell 110 may have, in at least one of first and second surfaces thereof, a textured structure having valley and peak shapes. When such a textured structure is applied to a first surface of the crystalline silicon substrate 111, a BSF layer 113 subsequently disposed on the first surface of the crystalline silicon substrate 111 also acquires the textured structure. In addition, when a textured structure is applied to a second surface of the crystalline silicon substrate 111, an emitter layer 112, a inter-layer 114, and a second solar cell 120 which are sequentially provided on the second surface of the crystalline silicon substrate 111 also acquire the textured structure.

Since light having a long wavelength incident on the tandem solar cell 100 is thus transmitted through the second solar cell 120 and enters the first solar cell 110 in an oblique direction, the reflectance at an interface between the inter-layer 114 and the first solar cell 110 can be reduced. In addition, since light having a long wavelength travels along an obliquely directed path in the first solar cell 110, there is an increase in a path of light, and therefore, a utilization rate of the light having a long wavelength can be improved in the first solar cell 110.

The second solar cell 120 has a perovskite absorption layer 122. In addition, the second solar cell 120 further includes an electron transport layer 121 and a hole transport layer 123.

In this case, the electron transport layer 121 may be disposed under the perovskite absorption layer 122, and the hole transport layer 123 may be disposed above the perovskite absorption layer 122. Here, the positions of the electron transport layer 121 and the hole transport layer 123 may be switched as necessary.

A metal oxide may be used for the electron transport layer 121. Non-limiting examples of the metal oxides constituting the electron transport layer 121 include Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, SrTi oxide, and the like. More preferably, for the electron transport layer 121, at least one metal oxide selected from among ZnO, $TiO_2$, $SnO_2$, $WO_3$, and $TiSrO_3$ is used.

In addition, on the electron transport layer 121, a mesoporous layer 125 including a metal oxide that is the same as or different from the metal oxide of the electron transport layer 121 may be further provided. The mesoporous layer 125 assists in facilitating the transfer of electrons or holes, particularly, electrons, to the inter-layer 114 to be described below after hole-electron pairs generated in the perovskite absorption layer 122 are broken into holes and electrons. At the same time, the mesoporous layer 125 also serves to lengthen the path of light by forming a light-scattering structure.

The perovskite absorption layer 122 is a photoactive layer including a compound having a perovskite structure, wherein the perovskite structure may be represented as $AMX_3$ (here, A refers to a monovalent organic ammonium cation or metal cation; M refers to a divalent metal cation; and X refers to a halogen anion). Non-limiting examples of compounds having a perovskite structure include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, $(CH_3NH_3)(HC(NH_2)_2)_{1-y}PbCl_xBr_{3-x}$ (0≤x, y≤1), and the like. Here, the A of $AMX_3$ may be partially doped with Cs in some cases. The hole transport layer 123 may be realized using a conductive polymer or a metal oxide. That is, as the conductive polymer, polyaniline, polypyrrole, polythiophene, poly(3,4-ethylenedioxythiophene)-poly(styrenesulfonate) (PEDOT:PSS), poly[bis(4-phenyl)(2,4,6-trimethylphenyl)amine] (PTAA), Spiro-MeOTAD, polyaniline-camphorsulfonic acid (PANI-CSA), or the like may be used. Meanwhile, as the metal oxide, Ni oxide, Mo oxide, V oxide, or the like may be used. In this case, the hole transport layer 123 may further include an n-type or p-type dopant as necessary.

The inter-layer 114 (also referred to as a tunnel junction layer or an intermediate layer) is disposed on the emitter layer 112 of the first solar cell 110, thereby serving to bond the first solar cell 110 and the second solar cell 120 together. Accordingly, the second solar cell 120 is electrically connected to the first solar cell 110 through the inter-layer 114.

In addition, the inter-layer 114 may be realized using a transparent conductive oxide, a carbonaceous conductive material, a metallic material, or a conductive polymer so that the light having a long wavelength transmitted through the second solar cell 120 can enter the first solar cell 110 disposed thereunder without transmission loss. In addition, the inter-layer 114 may be doped with an n-type or p-type material and used.

Here, as the transparent conductive oxide, indium tin oxide (ITO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum-doped zinc oxide (AZO), fluorine tin oxide (FTO), ZnO, or the like may be used. As the carbonaceous conductive material, graphene, carbon nanotubes, or the like may be used, and as the metallic material, metal (Ag) nanowires or a metal thin film having a multilayer structure (e.g., Au/Ag/Cu/Mg/Mo/Ti) may be used. As the conductive polymer, polyaniline, polypyrrole, polythiophene, PEDOT:PSS, PTAA, Spiro-MeOTAD, PANI-CSA, or the like may be used.

In addition, the inter-layer 114 may also be realized as a multilayer structure in which silicon layers having different refractive indices are alternately stacked multiple times. Here, the multilayer structure may include layers having a lower refractive index and layers having a higher refractive index, which are alternately stacked. Accordingly, with respect to the inter-layer 114, light having a short wavelength can be reflected toward the second solar cell 120, and light having a long wavelength can be transmitted toward the first solar cell 110. In this case, selective collection of light can be realized in the perovskite/silicon tandem solar cell 100.

Here, since the structure in which layers having a lower refractive index and layers having a higher refractive index are alternately stacked is provided above/under the transparent conductive oxide layer or the n+-type silicon layer, selective reflection/transmission of the above-described light can be realized.

The second electrode 130 is disposed on the second solar cell 120. In this case, the second electrode 130 may be directly disposed, in the form of a grid, on the second solar cell 120. That is, the second electrode 130 may be formed of only a grid electrode layer 118 directly disposed on the second solar cell 120, without including a transparent electrode layer 116.

In addition, the second electrode 130 may include a transparent electrode layer 116 disposed on the second solar cell 120 and a grid electrode layer 118 disposed on the transparent electrode layer 116.

Here, the transparent electrode layer 116 is formed on the entire upper surface of the second solar cell 120, thereby serving to collect electrical charges generated in the second solar cell 120. Such a transparent electrode layer 116 may be realized using various transparent conductive materials. That is, the transparent conductive material that is the same as the transparent conductive material of the inter-layer 114 may be used.

The grid electrode layer 118 is disposed on the transparent electrode layer 116, and is disposed on some parts of the transparent electrode layer 116.

Meanwhile, on the second surface of the crystalline silicon substrate 111, a buffer layer may be further disposed, but the addition thereof is not always required, and the buffer layer may be omitted as necessary. For the transmission of visible light, a transparent conductive compound or the like is preferable for the buffer layer. More specifically, as the transparent conductive oxide, ITO, ZITO, ZIO, ZTO, GITO, GIO, GZO, AZO, FTO, ZnO, or the like may be used.

The first electrode 140 is disposed on the first surface of the crystalline silicon substrate 111. In this case, a buffer layer may also be disposed on the first surface of the crystalline silicon substrate 111, but the addition thereof is not always required, and the buffer layer may be omitted as necessary. This buffer layer preferably includes a transparent conductive compound or the like that is the same as that of the buffer layer on the second surface.

The first electrode 140 is disposed on a rear surface of the perovskite/silicon tandem solar cell. In this case, the first electrode 140 may be directly disposed, in the form of a grid, at rear of the first solar cell 110. The first electrode 140 may be formed of only a grid electrode layer 119 directly provided at rear of the first solar cell 110 without including a transparent electrode layer 117.

In addition, the first electrode 140 may include a transparent electrode layer 117 disposed at rear of the first solar cell 110 and a grid electrode layer 119 disposed on the transparent electrode layer 117.

Such a first electrode 140 is in electrical contact with the BSF layer 113.

Accordingly, electrical charges generated in the first solar cell 110 are collected by the first electrode 140. In this case, it is preferred that the first electrode 140 is designed such that it is not disposed on the entire rear surface of the BSF layer 113 but only on some parts of the rear surface of the BSF layer 113 to allow sunlight to enter through the rear surface of the first solar cell 110.

In this case, the first electrode 140 is preferably disposed such that it occupies 1 to 30% of the total rear surface area of the BSF layer 113. When the first electrode 140 occupies less than 1% of the area, there is a concern that the effect of the first electrode 140 collecting electrical charges generated in the first solar cell 110 may be insufficient. On the other hand, when the first electrode 140 occupies more than 30% of the area, since an excessively large area is occupied by the first electrode 140, there is a concern that the utilization rate of light incident on the rear surface of the first solar cell 110 may be lowered.

When the first solar cell of the present disclosure is a heterojunction silicon solar cell, the first electrode 140 and the second electrode 130 of the present disclosure may be simultaneously formed. This is because, when a hydrogenated intrinsic amorphous silicon (i a-Si:H) layer is used as the passivation layer, the process temperature is limited to 250° C. or less to prevent the breaking of hydrogen bonds in the amorphous silicon. In this case, the first electrode 140 and the second electrode 130 may be formed through low-temperature firing at 250° C. or less using a first electrode paste that does not contain glass frit.

On the other hand, when the first solar cell of the present disclosure is a homojunction silicon solar cell, the first electrode 140 and the second electrode 130 may be formed using two processes and not simultaneously such that a higher-temperature firing process is carried out at 700° C. or more to form the first electrode 140 and a lower-temperature firing process is carried out at 250° C. or less using a second electrode paste not containing glass frit to form the second electrode 130.

In particular, it is preferable to form the second solar cell 120 and then the second electrode 130 after first forming the first electrode 140 by the high-temperature firing process. As the second solar cell 120 is exposed only to the firing process for forming the second electrode 130 which is carried out at a lower temperature of 250° C. or less, since there is no concern that the second solar cell 120 is exposed to the firing process for forming the first electrode 140 which is carried out at a higher temperature of 700° C. or more, the problem that the second solar cell 120 is degraded by high-temperature firing can be prevented in advance.

Hereinafter, a method of manufacturing the solar cell of FIGS. 2 and 3 will be described in detail with reference to exemplary embodiments.

Example: Method of Producing Tandem Solar Cell

FIGS. 4 to 9 are cross-sectional views illustrating the processes of a method of manufacturing a tandem solar cell according to one embodiment of the present disclosure.

Figure 4:
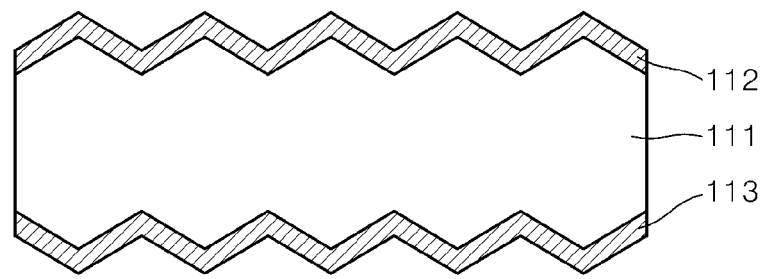
FIGS. 4 to 9 are cross-sectional views illustrating the processes of a method of manufacturing a tandem solar cell according to one embodiment of the present disclosure.

As shown in FIG. 4, a texturing pattern is formed by planarizing the first and second surfaces of a crystalline silicon substrate 111 and then texturizing at least one of the first and second surfaces.

In this case, the textured structure may be introduced to the crystalline silicon substrate 111 using any one method among a wet chemical etching method, a dry chemical etching method, an electrochemical etching method, and a mechanical etching method, but the present disclosure is not limited thereto. For example, the textured structure may be introduced by etching at least one of the first and second surfaces of the crystalline silicon substrate 111 in a basic aqueous solution.

More specifically, first, an n-type monocrystalline silicon substrate that has a thickness of several hundreds of micrometers to several thousands of micrometers and has been sliced along a (100) plane is provided. Next, a surface of the substrate is etched at a temperature ranging from room temperature to 150° C. using an aqueous solution prepared by adding an additive(s) such as a reaction regulator and/or a surfactant to a 1 to 5 wt % aqueous sodium hydroxide (NaOH) solution.

Through the etching, a texture having pyramidal irregularities is formed on the monocrystalline silicon substrate. Since monocrystalline silicon has a diamond cubic structure, a {111} plane is the most close-packed and chemically stable face. Therefore, since etching in a sodium hydroxide solution is the slowest in the {111} plane, after etching, anisotropic etching is found along the {111} plane of the silicon substrate. As a result, a texture having a depth of about 0.1 to 10 μm is uniformly formed on an entire surface of the silicon substrate.

Next, an emitter layer 112 is formed on the second surface of the crystalline silicon substrate 111. After the emitter layer 112 is formed, a back surface field layer 113 may be further formed on the first surface of the crystalline silicon substrate 111.

In the case of a heterojunction silicon solar cell, an amorphous intrinsic silicon (i a-Si:H) layer as a passivation layer is first deposited, by a plasma-enhanced chemical vapor deposition (PECVD) method using a silicon source material ($SiH_4$, $Si_2H_6$, etc.) and hydrogen ($H_2$), on a uniformly textured n-type silicon crystalline substrate. The PECVD method is particularly preferred as a method of manufacturing a heterojunction silicon solar cell because of the advantage that a process temperature can be lowered compared to common chemical vapor deposition (CVD) methods.

Next, a back surface field layer 113 doped with impurities of the same conductivity type as that of the silicon crystalline substrate is formed. Specifically, a PECVD process is used, and one or more types of gases selected from the group consisting of $SiH_4$, $Si_2H_6$, $SiHCl_3$, and $SiH_2Cl_2$ and $H_2$ gas are used as reactants, and $B_2B_6$ or $PH_3$ gas is used as a dopant gas. In this case, the temperature and pressure conditions of the PECVD process may be the same as the PECVD conditions for the amorphous intrinsic silicon layer.

When the first solar cell 110 is a heterojunction silicon solar cell, the first solar cell 110 can have a structure in which very thin amorphous intrinsic silicon (i a-Si:H) as a passivation layers are first formed on front and rear sides of an n-type crystalline silicon substrate, a p-type high-concentration amorphous silicon (p a-Si:H) layer as an emitter layer 112 is formed on the front side, and a high-concentration amorphous silicon (n+ a-Si:H) layer as a back surface field (hereinafter abbreviated as BSF) layer 113 is formed on the rear side.

On the other hand, in the case of a homojunction silicon solar cell, an emitter layer 112 and a BSF layer 113 may be formed through an ion implantation process. The emitter layer 112 is doped with boron as an impurity, and the BSF layer 113 is doped with phosphorous as an impurity. When the emitter layer 112 and the BSF layer 113 are formed through the ion implantation process, it is preferred that heat treatment is also performed at 700 to 1,200° C. to activate the impurities. In addition, the emitter layer 112 and the BSF layer 113 may also be formed through a high-temperature diffusion process using $BBr_3$, $POCl_3$, or the like, instead of the ion implantation process.

Figure 5:
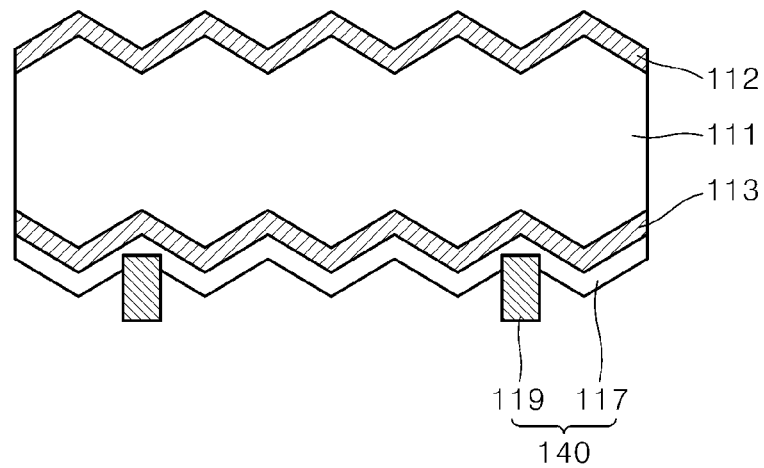

As shown in FIG. 5, the first electrode 140 is formed on the first surface of the crystalline silicon substrate 111.

In the case of a heterojunction silicon solar cell, for the above-described purpose of preventing the breaking of hydrogen bonds in the amorphous silicon, the process temperature for the first electrode 140 as well as the process temperature for the second electrode 130 is limited to 250° C. or less. In this case, the first electrode 140 may be formed before the second electrode 130 is formed, or the first electrode 140 and the second electrode 130 may be simultaneously formed.

In the case of the first electrode 140, a transparent electrode layer 117 is first formed on the BSF layer 113. When a transparent conductive oxide such as ITO, ZITO, ZIO, ZTO, or the like is used as a material for the transparent electrode layer, the transparent electrode layer 117 may be deposited by sputtering.

After the transparent electrode layer 117 is formed, a grid electrode layer 119 is formed. Although, of course, it is also possible to form the grid electrode layer 119 directly on the BSF layer 113 without forming the transparent electrode layer 117, since the carrier mobility of amorphous silicon is rather low to collect carriers through a metal grid, it is more preferred that a transparent electrode layer 117 is formed.

In this case, the grid electrode layer 119 is formed by applying a second electrode paste on the transparent electrode layer 117 by a screen-printing method and carrying out heat treatment at a first temperature (which is the same as a second temperature).

The first electrode 140 may be formed by selectively applying a first electrode paste not containing glass frit and then carrying out low-temperature firing at a first temperature. Here, the first electrode paste may contain metal particles and an organic material which is a binder for low-temperature firing, and the first electrode paste does not contain frit. In particular, the first temperature may be 250° C. or less and more specifically in a range of 100 to 200° C.

On the other hand, in the case of a homojunction silicon solar cell, the first electrode 140 and the second electrode 130 may be formed using two processes and not simultaneously such that a higher-temperature firing process is carried out at 700° C. or more to form the first electrode 140 and a lower-temperature firing process is carried out at 250° C. or less using a second electrode paste not containing frit to form the second electrode 130.

Here, the second electrode paste may be any one selected from among an Ag paste and an Ag/Al paste. In addition, the first electrode paste contains glass frit and an inorganic additive such as Ag particles, Ag/Al particles, or the like, and the first temperature may be 700° C. or more and more specifically in a range of 700 to 1,100° C.

In this case, the first electrode 140 is preferably designed such that it is not disposed on an entire rear surface of the BSF layer 113 but only on some parts of the rear surface of the BSF layer 113 to allow sunlight to enter through the rear surface of the first solar cell 110. In particular, the first electrode 140 is preferably disposed such that it occupies 1 to 30% of the total rear surface area of the BSF layer 113.

Figure 6:
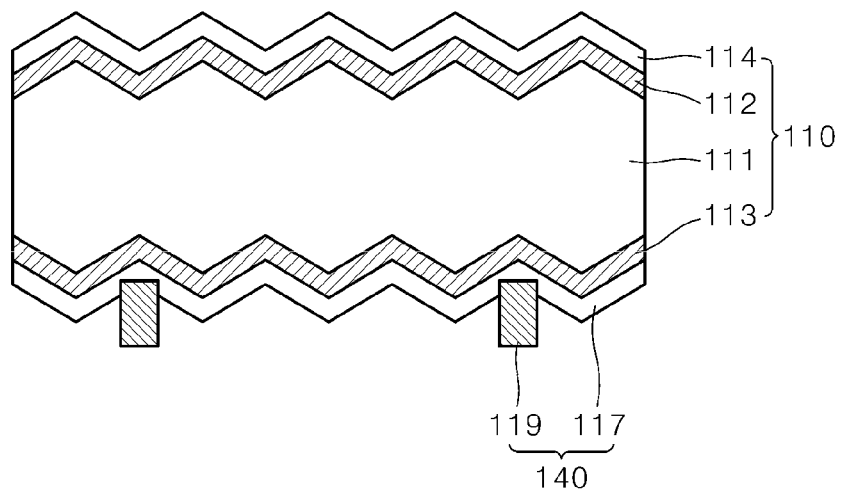

As shown in FIG. 6, a inter-layer 114 is formed on the emitter layer 112.

In this case, as a material for the inter-layer 114, a transparent conductive oxide, a carbonaceous conductive material, a metallic material, or a conductive polymer may be used. In addition, the inter-layer may be doped with an n-type or p-type material and used.

More specifically, when a transparent conductive oxide such as ITO, ZITO, ZIO, ZTO, or the like is used for the inter-layer 114, the inter-layer 114 may be deposited by sputtering. Alternatively, instead of using a transparent conductive oxide, an n-type amorphous silicon layer may be deposited by PECVD to form the inter-layer 114.

Next, a second solar cell 120 is formed on the inter-layer 114.

Figure 7:
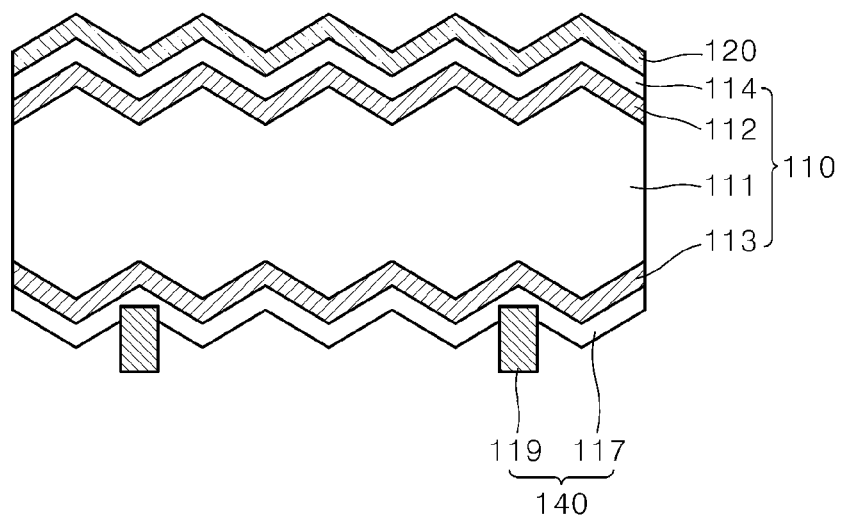

As shown in FIGS. 3 and 7, an operation of forming the second solar cell (perovskite solar cell) includes an operation of forming an electron transport layer 121 on the inter-layer 114, an operation of forming a perovskite absorption layer 122 on the electron transport layer 121, and an operation of forming a hole transport layer 123 on the perovskite absorption layer 122.

In addition, an operation of forming a mesoporous layer may be further included between the operation of forming an electron transport layer and the operation of forming a perovskite absorption layer. The electron transport layer 121 and the mesoporous layer 125 may be formed of the same metal oxide. For example, the electron transport layer 121 may be formed as a $TiO_2$ layer having a thickness of 5 to 100 nm, and the mesoporous layer 125 may be formed as a $TiO_2$ layer having a thickness of 500 nm or less.

Conventionally, perovskite absorption layers are mainly formed through a so-called solution process such as inkjet printing, gravure printing, spray coating, doctor-blade coating, bar coating, gravure coating, brush painting, slot-die coating, or the like. Such a solution process has advantages in that a light absorption layer constituting a photo-activation layer can be formed through very simple, easy, and inexpensive processes of applying and drying a solution. In addition, the solution process also has the advantage that a light absorption layer having coarse crystal grains can be formed, and, particularly, excellent conductivity for both electrons and holes is attained because spontaneous crystallization occurs due to the drying of an applied solution.

However, as can be understood from the term "solution process" itself, in a solution process, following the application of a solution to a substrate having a textured structure as in the present disclosure, the film is planarized due to leveling characteristics thereof. In this case, since the path of the light transmitted through the second electrode 130 is shortened and reflectance is increased, there is a high possibility that solar cell efficiency may be lowered.

In the present disclosure, in order to completely transfer the contour of the textured substrate in forming the perovskite absorption layer, a plurality of precursor layers are sequentially formed. More specifically, in the present disclosure, a first precursor layer that conforms to the textured surface is first deposited on a textured electron transport layer or mesoporous layer by sputtering.

The deposition of the first precursor layer is accomplished by forming a first precursor layer made of $PbI_2$ on the textured electron transport layer 121 or mesoporous layer 125 by sputtering. Of course, besides $PbI_2$, a component having a $BX_2$ structure in which B includes one or more among $Pb^{2+}$, $Sn^{2+}$, $Cu^{2+}$, $Ca^{2+}$, $Sr^{2+}$, $Cd^{2+}$, $Ni^{2+}$, $Mn^{2+}$, $Fe^{2+}$, $Co^{2+}$, $Pd^{2+}$, $Ge^{2+}$, $Yb^{2+}$, and $Eu^{2+}$ and X includes one or more among $F^-$, $Cl^-$, $Br^-$, and $I^-$ may be used, and the component may be replaceable.

Specifically, the deposition by a sputtering process is carried out under inert gas (Ar, He, or Ne) pressure conditions of 0.1 to 20 mTorr and electric power conditions of 100 to 300 W, using a target containing a $PbI_2$ component. In this case, the temperature of a substrate is maintained within a range of room temperature to 100° C. In addition, since the component of the target is not a metal, RF sputtering which uses radio frequency is used as the sputtering method.

Here, when the pressure of the gas is 1 mTorr or less, sputtered particles collide less frequently with the inert gas until reaching the substrate. As a result, the speed and the kinetic energy of component particles to be deposited reaching the substrate become excessively high, making it difficult to form a porous film. On the other hand, when the pressure of the gas exceeds 20 mTorr, sputtered particles cannot move straight, and are even scattered in severe cases, due to frequently colliding with the inert gas, resulting in a problem that the deposition speed is excessively low although a porous film is obtained.

In addition, when the electric power is 100 W or less, since the speed and the kinetic energy of sputtered particles are excessively low, there is the disadvantage that the deposition speed is excessively low although a porous film is obtained. On the other hand, when the electrical power is 300 W or more, the speed and the kinetic energy of sputtered particles are very high such that there is difficulty in forming a porous film.

Meanwhile, the lower the temperature of the substrate, the better. When the temperature of the substrate is higher than 100° C., sputtered particles on the substrate are supplied with sufficient thermal energy and thus have sufficient mobility to move to a stable position before subsequent sputtered particles reach the substrate. Therefore, when the temperature of the substrate is high, there is difficulty in forming a porous film.

The porous first precursor layer formed in the present disclosure preferably has a thickness of 50 nm to 10 μm and more preferably has a thickness of 50 to 500 nm.

When the thickness of the porous first precursor layer is less than 50 nm, since a light absorption path is short, incident light cannot be sufficiently absorbed and is mostly transmitted through the porous first precursor layer, and therefore, there is a problem that a large amount of light is lost. On the other hand, when the thickness of the porous first precursor layer exceeds 500 nm, there is a problem that parasitic absorption is increased and a process time is excessively increased.

In addition, it is preferred that the porous first precursor layer has a porosity of 10 to 50% by volume. When the porosity is less than 10%, since the thin film is too dense, a reaction thereof with a subsequent second precursor layer is either too slow or not completed, and therefore, there is difficulty in forming the final perovskite layer. On the other hand, when the porosity of the thin film exceeds 50%, there is a high possibility that interface defects and voids occur at an interface between the substrate and the perovskite layer.

The porosity of a thin film, particularly, the porosity of a thin film having nano-sized pores, can be measured by a small-angle neutron scattering (SANS) method or a grazing-incidence small-angle X-ray scattering (GISAXS) method.

In particular, the GISAXS analysis is a method in which a scattering pattern of an X-ray beam incident on a surface of a thin film at a specific angle is analyzed by a charge-coupled two-dimensional detector. The GISAXS analysis method has the advantages that the scattering path of an X-ray beam is long enough compared to other analysis methods, there is little scattering with respect to other components, and a process of preparing a test specimen is relatively simple.

After the porous first precursor layer is formed, an operation of forming a second precursor layer on the porous first precursor layer is carried out.

The second precursor layer of the present disclosure is preferably formed of a halide, and more preferably, the halide includes an organic halide.

In one embodiment of the present disclosure, a second precursor layer having a $CH_3NH_3I$ composition is formed on the $PbI_2$ layer.

Of course, besides the above-described component, the second precursor layer may also be formed of a component which includes one or more among a monovalent C1-C20 alkyl group, an alkyl group substituted with an amine group, an organic amidinium, and an alkali metal and an X component including one or more among $F^-$, $Cl^-$, $Br^-$, and $I^-$.

The second precursor layer may be formed using a process such as a thermal evaporation method, a sputtering method, a CVD method, a spin coating method, a dip coating method, a spraying method, or the like, and the process is not particularly limited unlike the process of forming the first precursor layer.

After the second precursor layer is formed, a post-thermal process is carried out to form a thin perovskite layer. The post-thermal process is carried out at a temperature ranging from room temperature to 200° C. for at most about three hours. A lower limit of the post-thermal temperature is not particularly limited. However, at a post-thermal temperature exceeding 200° C., the second precursor layer may undergo thermal decomposition or a change in composition caused by thermal decomposition before even reacting with the first precursor layer to form a perovskite layer.

During the post-thermal process, the components of the second precursor layer penetrate into the first precursor layer, which is a porous layer, to form a perovskite photoactive layer.

A final thickness of the perovskite absorption layer obtained by such a process becomes substantially the same as the thickness of the first precursor layer. This is because the final perovskite layer is formed by the penetration of the components of the second precursor layer into the porous first precursor layer.

After the perovskite absorption layer 122 is formed, a hole transport layer 123 is formed thereon. The hole transport layer 123 is a layer which allows the holes generated in the perovskite layer to be easily transferred to the second electrode 130, and should be able to ensure the ability to transmit visible light and conduct holes.

Meanwhile, in order to apply a solution process that can be used for the second precursor layer to also the hole transport layer 123, a polymer material is generally suitable as a material for the hole transport layer 123. In the present disclosure, a hole transport layer may be formed by carrying out spin coating for 40 to 50 seconds at a speed of 3000 to 5000 rpm using a polymer material such as PEDOT:PSS.

More specifically, in the method of forming a hole transport layer, a solution process such as a printing process may be applied after dissolving any one of PEDOT:PSS, poly(9-vinylcarbazole) (PVK), poly[(9,9-dioctylfluorenyl-2,7-diyl)-co-(4,4'(N-(4-sec-butylphenyl)diphenylamine))] (TFB), copper phthalocyanine (CuPc), N,N'-diphenyl-N,N'-bis(1-naphthyl)-1,1'-biphenyl-4,4'-diamine (α-NPD), and N,N'-bis-(3-methylphenyl)-N,N'-bis-phenyl(1,1'-biphenyl)-4,4'-diamine (TPD) into a liquid phase.

The hole transport layer 123 may include a monomer or polymer hole transport material or a metal oxide besides the above-described components. In addition, besides the above-described solution process, a solution process such as a dip coating method, a spraying method, or the like or even a deposition process such as a thermal evaporation method, a sputtering method, or the like may also be applied.

Figure 8:
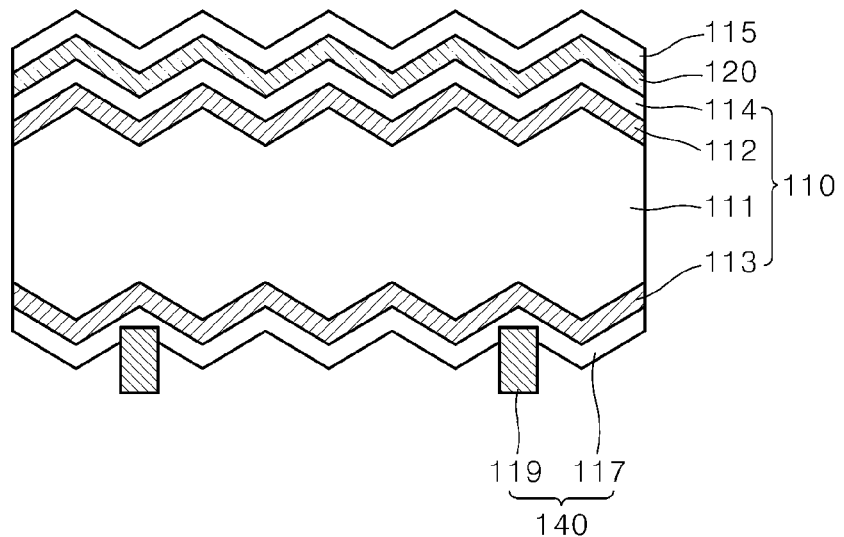
Figure 9:
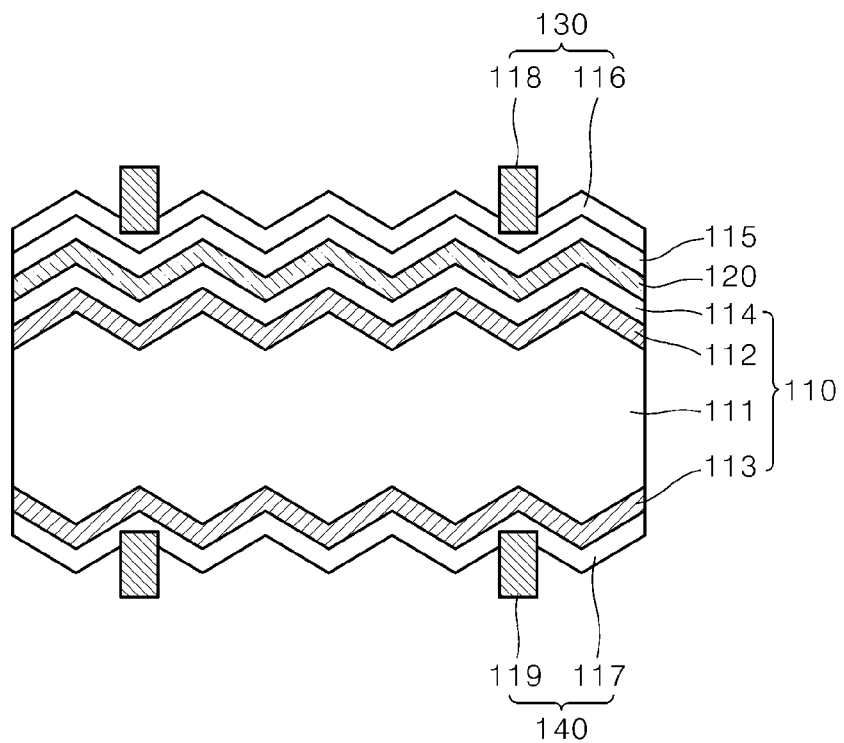

As shown in FIG. 8, after the hole transport layer 123 is formed, a buffer layer 115 may be formed as necessary. It is basically required that the buffer layer has the ability to transmit visible light while being able to protect the perovskite layer thereunder.

For the transmission of visible light, a transparent conductive compound or the like is preferable for the buffer layer 115. More specifically, as the transparent conductive oxide, ITO, ZITO, ZIO, ZTO, GITO, GIO, GZO, AZO, FTO, ZnO, or the like may be used.

A second electrode 130 is formed on the buffer layer 115 or the hole transport layer 123. Here, the second electrode 130 may include a transparent electrode layer 116 disposed on the perovskite solar cell 120 and a grid electrode layer 118 disposed on the transparent electrode layer 116 (see FIG. 9).

Here, the transparent electrode layer 116 is formed on the entire upper surface of the second solar cell 120, thereby serving to collect electrical charges generated in the second solar cell 120. Such a transparent electrode layer 116 may be realized using various transparent conductive materials. That is, as the transparent conductive material, the same material as the transparent conductive material of the interlayer 114 may be used.

The grid electrode layer 118 is disposed on the transparent electrode layer 116, and is disposed on some parts of the transparent electrode layer 116.

In this case, the second electrode 130 may be formed by selectively applying a second electrode paste not containing glass frit and then carrying out low-temperature firing at a second temperature. Such a second electrode paste may contain metal particles and an organic material which is a binder for low-temperature firing, and the second electrode paste does not contain glass frit. In particular, the second temperature may be 250° C. or less and more specifically in a range of 100 to 200° C.

As described above, in the case of a heterojunction silicon solar cell, the first electrode 140 may be simultaneously formed with the second electrode 130 during the formation of the second electrode 130, or the second electrode 130 may be formed after the first electrode 140 and then the second solar cell are formed. In addition, in the case of a heterojunction silicon solar cell, both the first electrode 140 and the second electrode 130 are formed by a firing process carried out at a lower temperature of 250° C. or less.

On the other hand, in the case of a homojunction silicon solar cell, first and second electrodes should be formed using two processes such that a higher-temperature firing process is carried out at 700° C. or more to form the first electrode 140 and a lower-temperature firing process which follows the formation of a second solar cell 120 is carried out at 250° C. or less to form the second electrode 130. This is to prevent, in advance, the problem that the second solar cell 120 is degraded by high-temperature firing.

As described above, in the present disclosure, since a conformal perovskite absorption layer is formed on a substrate having a textured structure, it is possible not only to reduce the reflectance of light but also to lengthen a path of light, and thus the properties of the device are improved.

In addition, with the above-described method of manufacturing a tandem solar cell according to one embodiment of the present disclosure, since a porous first precursor layer is formed by sputtering and then a perovskite absorption layer is formed by forming a second precursor layer on the first precursor layer, it is possible to form a conformal perovskite absorption layer that thoroughly reflects the contour of a substrate having a textured structure.

Figure 10:
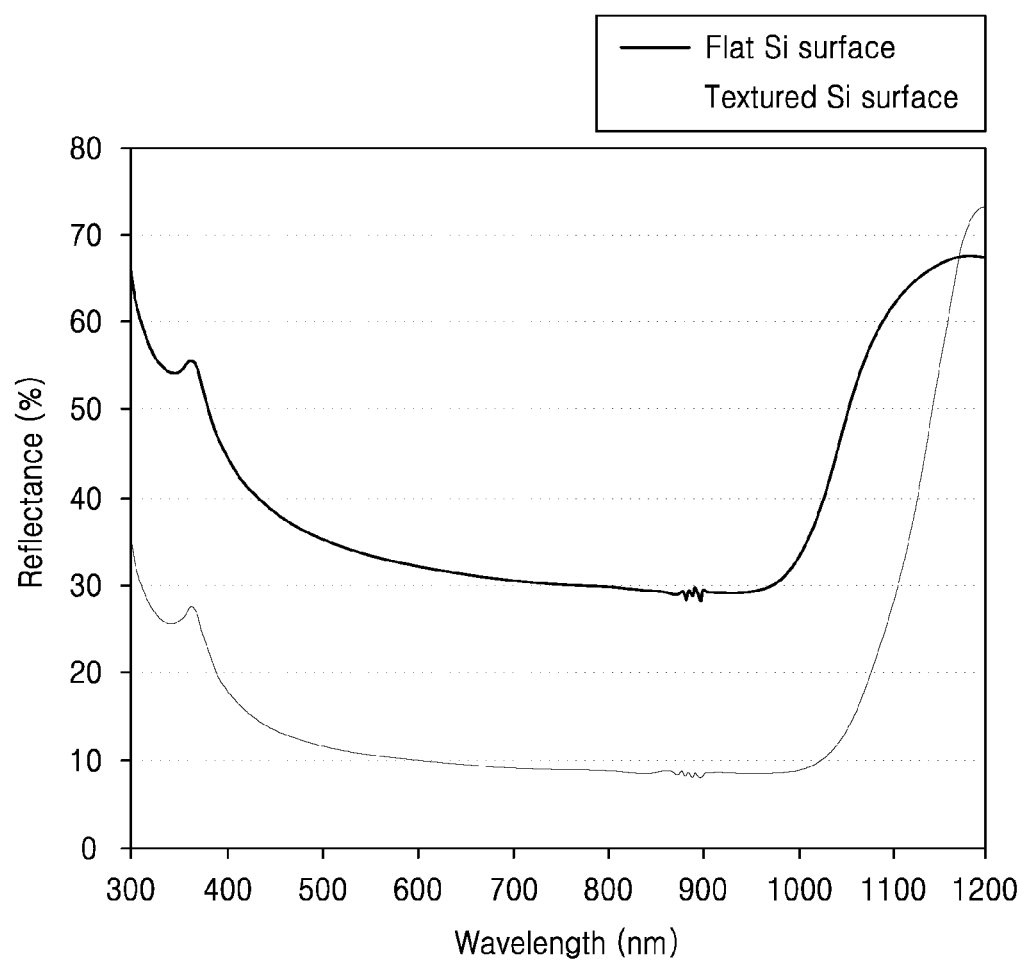
FIG. 10 illustrates a measurement result of the reflectance of silicon substrates according to surface conditions of the substrates.

FIG. 10 illustrates a measurement result of the reflectance of Si substrates according to surface conditions of the substrates. Referring to FIG. 10, it can be seen that a textured Si surface has about a 20% or more reduction in light reflection compared to a flat Si surface, in the entire wavelength region.

Figure 11:
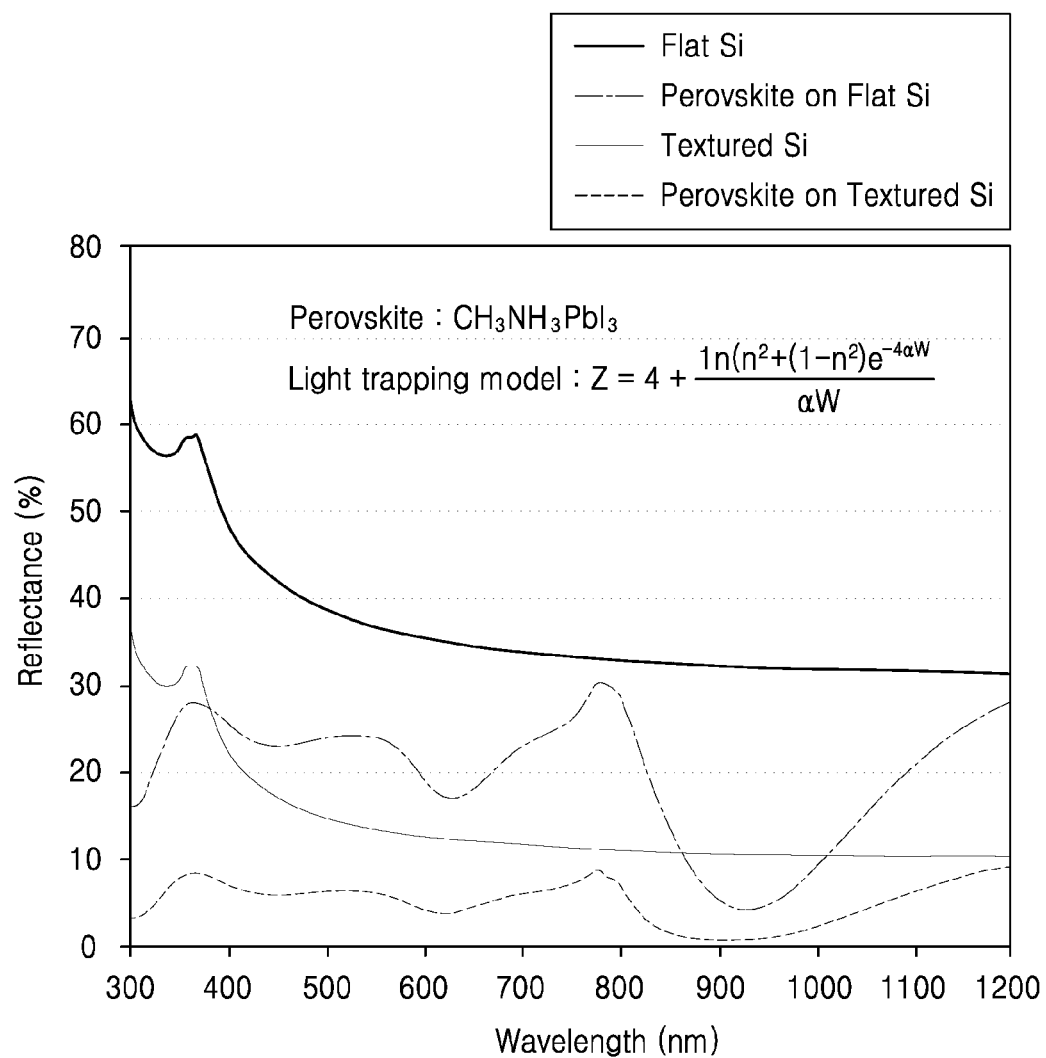
FIG. 11 illustrates a simulated reflectance to be obtained after a perovskite absorption layer is formed on a surface of each of the silicon substrates of FIG. 10.

In addition, FIG. 11 illustrates the result of simulating the reflectances of solar cells in which a perovskite layer is formed on the substrates of FIG. 10. Referring to FIG. 11, it can be seen that, in the wavelength range of 380 to 780 nm which corresponds to the wavelength range of visible light, a perovskite layer formed on a textured silicon substrate has a lower reflectance of light than a perovskite layer formed on a flat silicon substrate.

It can be seen that this result directly suggests that a perovskite solar cell formed on a textured substrate and a tandem solar cell including the perovskite solar cell are capable of improving the solar cell efficiency by reducing the reflection of light compared to a solar cell having a flat substrate.

While the present disclosure has been described above, it is apparent that the invention is not limited to the embodiments disclosed herein and that various modifications may be made by those skilled in the art within the scope of the technical idea of the invention. In addition, although the effects of the configurations of the invention are not explicitly described in the description of the embodiments of the invention, it is apparent that the effects predictable by the configurations should also be recognized.

The invention claimed is:

1. A method of manufacturing a perovskite/silicon tandem solar cell, the method comprising:

performing a RF (radio frequency) sputtering process of forming a microporous first precursor thin film on a substrate including a texture structure; and performing a process of forming a halide thin film on the microporous first precursor thin film, wherein the microporous first precursor thin film has a $BX_2$ structure, and wherein B includes one or more among $Pb^{2+}$, $Sn^{2+}$, $Cu^{2+}$, $Ca^{2+}$, $Sr^{2+}$, $Cd^{2+}$, $Ni^{2+}$, $Mn^{2+}$, $Fe^{2+}$, $Co^{2+}$, $Pd^{2+}$, $Ge^{2+}$, $Yb^{2+}$, and $Eu^{2+}$, and X includes one or more among F–, Cl–, Br–, and I–.

2. The method of claim 1, wherein the microporous first precursor thin film has a porosity of 10% to 50% by volume.

3. The method of claim 1, wherein the halide thin film includes an organic halide.

4. The method of claim 1, wherein the halide thin film has an AX structure, wherein A consists of one or more among a monovalent C1-C20 alkyl group, an alkyl group substituted with an amine group, an organic amidinium, and an alkali metal, and X consists of one or more among F–, Cl–, Br–, and I–.

5. The method of claim 1, wherein the performing of the process of forming the halide thin film includes performing any one method among a thermal evaporation method, a sputtering method, a spin coating method, a dip coating method, a chemical vapor deposition method, and a spraying method.

6. The method of claim 1 further comprising performing a post-thermal process after the performing of the process of forming the halide thin film.

7. The method of claim 6, wherein the post-thermal process is carried out at a temperature of 25° C. to 200° C. for at most three hours.

8. The method of claim 6, wherein a thin film formed by the post-thermal process has a thickness of 50 nm to 10 μm.

9. The method of claim 1, wherein the RF sputtering process sputters a $BX_2$ compound of the $BX_2$ structure as a target material.

10. The method of claim 1, wherein the substrate is a monocrystalline silicon substrate, and wherein the texture structure is formed of pyramidal irregularities.

11. The method of claim 1, wherein the performing of the RE sputtering process transfers a contour of the textured structure of the substrate to the microporous first precursor thin film.

12. The method of claim 1, wherein the $BX_2$ structure is formed entirely by the RE sputtering process.

* * * * *